United States Patent [19]

Foster et al.

[11] Patent Number: 6,086,680
[45] Date of Patent: Jul. 11, 2000

[54] LOW-MASS SUSCEPTOR

[75] Inventors: Derrick W. Foster, Scottsdale; Cornelius A. van der Jeugd, Tempe; John F. Wengert, Phoenix, all of Ariz.

[73] Assignee: ASM America, Inc., Phoenix, Ariz.

[21] Appl. No.: 08/621,627

[22] Filed: Mar. 26, 1996

Related U.S. Application Data

[60] Provisional application No. 60/002,632, Aug. 22, 1995.

[51] Int. Cl.[7] .................................... C23C 16/00
[52] U.S. Cl. ...................... 118/725; 118/728; 118/729; 118/500
[58] Field of Search ................... 118/725, 728, 118/729, 500

[56] References Cited

U.S. PATENT DOCUMENTS

| | | |
|---|---|---|
| 3,407,783 | 10/1968 | Capita . |
| 3,549,847 | 12/1970 | Clark et al. . |
| 3,641,974 | 2/1972 | Yamada et al. . |
| 4,522,149 | 6/1985 | Garbis et al. . |
| 4,560,420 | 12/1985 | Lord . |
| 4,710,428 | 12/1987 | Tamamizu et al. . |
| 4,958,061 | 9/1990 | Wakabayashi et al. . |
| 4,978,567 | 12/1990 | Miller . |
| 4,990,374 | 2/1991 | Keeley et al. . |
| 5,033,407 | 7/1991 | Mizuno et al. . |
| 5,044,943 | 9/1991 | Bowman et al. . |
| 5,098,198 | 3/1992 | Nulman .................................. 374/121 |
| 5,108,792 | 4/1992 | Anderson et al. . |
| 5,119,540 | 6/1992 | Kong et al. . |
| 5,119,541 | 6/1992 | Ohmi et al. . |
| 5,121,531 | 6/1992 | Severts et al. . |
| 5,156,820 | 10/1992 | Wong et al. . |
| 5,199,483 | 4/1993 | Bahng . |
| 5,200,157 | 4/1993 | Toya et al. . |
| 5,298,465 | 3/1994 | Levy . |
| 5,306,699 | 4/1994 | Eddy . |
| 5,308,645 | 5/1994 | Zachman et al. . |

(List continued on next page.)

FOREIGN PATENT DOCUMENTS

| | | |
|---|---|---|
| 0339279A2 | 11/1988 | European Pat. Off. . |
| 0445596A2 | 9/1991 | European Pat. Off. . |
| 0634785A1 | 1/1995 | European Pat. Off. . |
| 0669640A1 | 8/1995 | European Pat. Off. . |
| 0840358A2 | 5/1998 | European Pat. Off. . |
| 7-58039 | 8/1993 | Japan . |
| 2181458A | 3/1987 | United Kingdom . |

OTHER PUBLICATIONS

"Shaping the Future in Semiconductor Processing," advertisment, *Ceramic Solutions*, vol. 73, No. 7, Jul. 1994; attached advertisements (circa 1993).

*Primary Examiner*—Richard Bueker
*Attorney, Agent, or Firm*—Knobbe, Martens, Olson & Bear, LLP

[57] ABSTRACT

A wafer susceptor for semiconductor processing devices, having a thermal mass which is close to that of the wafer. The similarity between the thermal masses of the susceptor and wafer enables a higher throughput and reduces temperature uniformities across the wafer. The low-mass susceptor may be made of a solid, thin disk with or without a central wafer support recess. A wafer temperature sensing aperture may be provided in the center of the susceptor. Alternatively, a low-mass susceptor is formed with an open-celled silicon carbide foam, with or without a thin skin of solid silicon carbide on the top forming a wafer support surface, or completely encapsulating the open-celled foam. The wafer is preferably supported on a plurality of pins extending upward from the susceptor. In a third embodiment, an ultra low-mass susceptor is formed as a ring with a central throughbore and a surrounding wafer support shelf below an outer ledge.

15 Claims, 6 Drawing Sheets

U.S. PATENT DOCUMENTS

| | | |
|---|---|---|
| 5,332,442 | 7/1994 | Kubodera et al. . |
| 5,343,938 | 9/1994 | Schmidt . |
| 5,354,715 | 10/1994 | Wang et al. . |
| 5,356,486 | 10/1994 | Sugarman et al. . |
| 5,370,739 | 12/1994 | Foster ........................................ 118/728 |
| 5,383,971 | 1/1995 | Selbrede . |
| 5,393,349 | 2/1995 | Ohkase . |
| 5,403,401 | 4/1995 | Haafkens et al. . |
| 5,444,217 | 8/1995 | Moore ........................................ 219/405 |
| 5,456,757 | 10/1995 | Aruga et al. . |
| 5,467,220 | 11/1995 | Xu . |
| 5,492,566 | 2/1996 | Sumnitsch . |
| 5,514,439 | 5/1996 | Sibley . |
| 5,527,393 | 6/1996 | Sato ........................................ 118/725 |
| 5,549,756 | 8/1996 | Sorensen ................................ 118/725 |
| 5,551,985 | 9/1996 | Brors et al. . |
| 5,558,717 | 9/1996 | Zhao ........................................ 118/728 |
| 5,645,646 | 7/1997 | Beinglass et al. . |
| 5,656,093 | 8/1997 | Burkhart et al. . |
| 5,683,518 | 11/1997 | Moore et al. . |
| 5,700,725 | 12/1997 | Hower et al. . |
| 5,738,165 | 4/1998 | Imai . |
| 5,803,977 | 9/1998 | Tepman ................................ 118/728 |

LOW-MASS SUSCEPTOR

CROSS-REFERENCE TO RELATED APPLICATION

Pursuant to 35 U.S.C. § 119(e), this application claims the priority benefit of provisional application Ser. No. 60/002,632 filed Aug. 22, 1995.

FIELD OF THE INVENTION

The present invention relates to supports for wafers in semiconductor processing chambers, and more particularly to a low-mass susceptor for supporting a wafer within a chemical vapor deposition chamber.

BACKGROUND OF THE INVENTION

High-temperature ovens, called reactors, are used to process semiconductor wafers from which integrated circuits are made for the electronics industry. A circular wafer or substrate, typically made of silicon, is placed on a wafer support called a susceptor. Both the wafer and susceptor are enclosed in a quartz chamber and heated, typically by a plurality of radiant lamps placed around the quartz chamber. A reactant gas is passed over the heated wafer, causing the chemical vapor deposition (CVD) of a thin layer of the reactant material on the wafer. Through subsequent processes in other equipment, these layers are made into integrated circuits, with a single layer producing from tens to thousands of integrated circuits, depending on the size of the wafer and the complexity of the circuits.

If the deposited layer has the same crystallographic structure as the underlying silicon wafer, it is called an epitaxial layer. This is also sometimes called a monocrystalline layer because it has only one crystal structure.

Various CVD process parameters must be carefully controlled to ensure the high quality of the resulting semiconductor. One such critical parameter is the temperature of the wafer during the processing. The deposition gas reacts at particular temperatures and deposits on the wafer. If the temperature varies greatly across the surface of the wafer, uneven deposition of the reactant gas occurs.

In certain batch processors (i.e., CVD reactors which process more than one wafer at a time) wafers are placed on a relatively large-mass susceptor made of graphite or other heat-absorbing material to help the temperature of the wafers remain uniform. In this context, a "large-mass" susceptor is one which has a large thermal mass relative to the wafer. The thermal mass of a solid, or its lumped thermal capacitance, is given by the equation:

$$C_T = \rho V c$$

where:

$\rho$ = the density of the solid, $V$ = the volume of the solid, and $c$ = the specific heat (heat capacity) of the solid.

Thus, the thermal mass is directly related to its mass, which is equal to the density times volume and to its specific heat.

One example of a large-mass susceptor is shown in U.S. Pat. No. 4,496,609 issued to McNeilly, which discloses a CVD process wherein the wafers are placed directly on a relatively large-mass slab-like susceptor and maintained in intimate contact to permit a transfer of heat therebetween. The graphite susceptor supposedly acts as a heat "flywheel" which transfers heat to the wafer to maintain its temperature uniform. The goal is to reduce transient temperature variations around the wafer that would occur without the "flywheel" effect of the susceptor.

Although large-mass susceptors theoretically increase temperature uniformity across the wafers during steady state, the large thermal mass of the susceptor makes it slower to respond to temperature transients than the wafer, resulting in instances where the temperatures of the two elements are different. This is highly undesirable because during temperature transients, the wafer temperature does not correspond to the temperature of the susceptor, and the process becomes difficult to control. Temperature nonuniformities will easily occur across the wafer surface during these transients.

In recent years, single-wafer processing of larger diameter wafers has grown for a variety of reasons including its greater precision as opposed to processing batches of wafers at the same time. Typical wafers are made of silicon with one common size having a diameter of 200 mm and a thickness of 0.725 mm. Assuming a density of silicon of 2330 Kg/m³, and a specific heat of 913 J/kg/° K. at 800° K., the thermal mass of such a wafer used in single-wafer processing is approximately 48 J/° K. Recently, larger silicon wafers having a diameter of 300 mm and a thickness of 0.775 mm have been proposed, as they even more efficiently exploit the benefits of larger single-wafer processing. The thermal mass of 300 mm wafers is approximately 117 J/° K. Additionally, even larger wafers are contemplated for the future.

Although single-wafer processing by itself provides advantages over batch processing, control of the process parameters remains critical and is perhaps more so because of the increased cost of the larger wafers. One example of a single-wafer processor is shown in U.S. Pat. No. 4,821,674, which utilizes a circular rotatable susceptor having a diameter slightly larger than the wafer. This susceptor is preferably made of graphite and has a much lower thermal mass than the aforementioned slab-type batch processing susceptor. One of the advantages of a reduced thermal mass is a reduced cycle time and increased throughput. Nevertheless, the thermal mass of a production version of the susceptor described in U.S. Pat. No. 4,821,674 is much larger than the thermal mass of the wafer, which may lead to temperature differences between the wafer and susceptor from thermal transients during the process. In these systems, moreover, the temperature at points around the susceptor and wafer should be monitored, which requires complex thermocouple or pyrometer apparatusses.

The heat transfer between the susceptor and wafer depends on the geometrical projection of the surface area of one body on the other. Thus, the area directly underneath the wafer is best used when calculating and comparing susceptor thermal masses. The thermal mass of the region of the susceptor directly underneath the wafer will be termed the "effective" thermal mass. The peripheral area outside this region affects heat transfer between the susceptor and wafer to a lesser extent, although large edge losses can create unwanted temperature differentials in the susceptor. The effective thermal mass for a standard disk-shaped susceptor of varying sizes can be expressed as a constant x times the square of the diameter of the wafer being supported. In other words, from the above equation for thermal mass the following ratio can be derived:

$$C_{T,eff} = xD^2$$

where:

$C_{T,eff}$ = effective thermal mass of the susceptor [J/° K.]

$D$ = diameter of the wafer [m], and x=multiplication factor [J/° K./m$_2$],
where:

$$x = \frac{\pi}{4}\rho tc$$

and where:
 ρ=density of the solid [kg/m$_3$],
 t=thickness of the susceptor [m], and
 c=specific heat (heat capacity) of the solid [J/° K.].

One graphite susceptor utilized in the single-wafer processing system described in U.S. Pat. No. 4,821,674, for example, has a diameter of 220 mm, a thickness of 6.4 mm, a density of 2250 kg/m$^3$, and a mass of 0.57 kg. With a heat capacity of 1650 J/kg/° K. at 800° K., the graphite susceptor has an effective thermal mass (i.e., directly under a 200 mm wafer) of approximately 746 J/° K. at 800° K., which is more than fifteen times the thermal mass of the 200 mm wafer. For these susceptors, and using SI units, the multiplication factor x equals about 18,661 J/° K./m$_2$. Thus, for 300 mm wafers, the effective thermal mass of the graphite susceptor is, $$C_{T,\text{eff}} = 18,661(0.3)^2 = 1,680 \text{ J/° K.}$$

which is more than fourteen times the thermal mass of the 300 mm wafer. (Of course, these numbers will be modified with the use of English units and constants.) These large differences in the thermal masses of the susceptor and wafer mean the susceptor lags behind the wafer significantly during fast heat-up and cool-down cycles.

FIG. 1 illustrates schematically a sequence of heat-up and cool-down of a prior art single-wafer processor circular susceptor and wafer thereon. As illustrated, the wafer has a steeper temperature climb during the heat-up stage so that it reaches and surpasses a steady state temperature well before the susceptor. There may be some overshoot of temperature, which is exaggerated in the drawing, due to a delay in response of the wafer and susceptor to the varying intensity of the radiant heat lamps. Ultimately, the two elements attain a steady state temperature until a cool-down period, whereupon the wafer cools down much faster than the susceptor. Not only do temperature differences create a risk of temperature non-uniformity on the wafer, the process throughput is limited by the time it takes for the susceptor to heat up and cool down. High throughput remains a prime concern in single-wafer semiconductor processing.

The edges of the susceptor will be colder than the center when the susceptor is uniformly irradiated from the top and/or bottom. Edge losses are significant in many thick susceptors due to their large surface area on the edges. This situation is schematically indicated in FIG. 2 which shows relatively large heat losses at the edge of a thick susceptor. The edge surface area of the graphite susceptor used in conventional single-wafer processing is 4.5×10$^{-3}$ m$^2$, which is approximately 5% of the total surface area. The temperature nonuniformity of the susceptor from large edge losses may result in a temperature nonuniformity of the wafer, as seen in the graph of FIG. 3, which affects the quality of the resulting semiconductor. Various solutions have been offered to accommodate for the reduced temperature at the edges of the susceptors, including placing structures around the susceptors and modifying the intensity of heat radiated to different areas of the susceptor. All of these are complicated and increase the cost of the resulting processing apparatus.

Consequently, there is a need for an improved susceptor to increase throughput of semiconductor processing devices while ensuring temperature uniformity across the wafer surface.

SUMMARY OF THE INVENTION

The present invention solves many problems associated with thermal variations between wafers and susceptors by providing a low-mass susceptor having a thermal mass of the same order of magnitude as the wafer. In one embodiment, the low-mass susceptor is formed as a thin, disk-shaped circular body having a thickness close to the thickness of the wafer being processed. For typical 0.029 inch (0.74 mm) thick wafers, the susceptor body has a thickness of no more than 0.032 inches (0.81 mm). To minimize edge heat loss, the peripheral edge of the susceptor is the same thickness as the body. A large central recess may be formed in the top surface for receiving wafers to be processed therein. In this regard, the recess is defined within an outer ledge and has a depth sufficient to position the top surface of the wafer in the plane of the ledge. Desirably, spacers formed integrally with or attached to the top surface of the susceptor define a wafer platform to create a gap between the wafer and susceptor. The gap thus formed facilitates pickup of the wafer by a robot arm pickup device. In one particular embodiment, the spacers are ceramic pins inserted in apertures evenly spaced about the top surface of the susceptor. A large central bore may be provided in the recess to create a ring-shaped susceptor with a thermal mass less than that of the wafer.

In another embodiment, a thicker low-mass susceptor is formed out of an open-cell silicon carbide foam having a reduced thermal mass from previous graphite susceptors. The three-dimensional character of the foam susceptor enables formation of a nearly complete circular groove in its lower surface adapted to receive arms of a susceptor support without regard to rotation registry therebetween. Also, a central downwardly facing cavity is provided for receiving a sensing end of a thermocouple. The cavity terminates just below the top surface of the susceptor for enhanced accuracy in reading the temperature at the center of the wafer. Alternatively, a through hole may be formed in the susceptor to enable temperature sensing of the underside of the wafer. As in the first embodiment, a large central recess may be formed in the top surface for receiving wafers to be processed therein. The recess is defined within an outer ledge and has a depth sufficient to position the top surface of the wafer in the plane of the ledge. Desirably, spacers formed integrally with or attached to the top surface of the susceptor define a wafer platform to create a gap between the wafer and susceptor. A thin skin of dense silicon carbide may be deposited or otherwise mounted on at least the top surface of the foam susceptor, and optionally covering the entire foam susceptor.

DETAILED DESCRIPTION OF THE PREFERRED EMBODIMENTS

Figure 1:
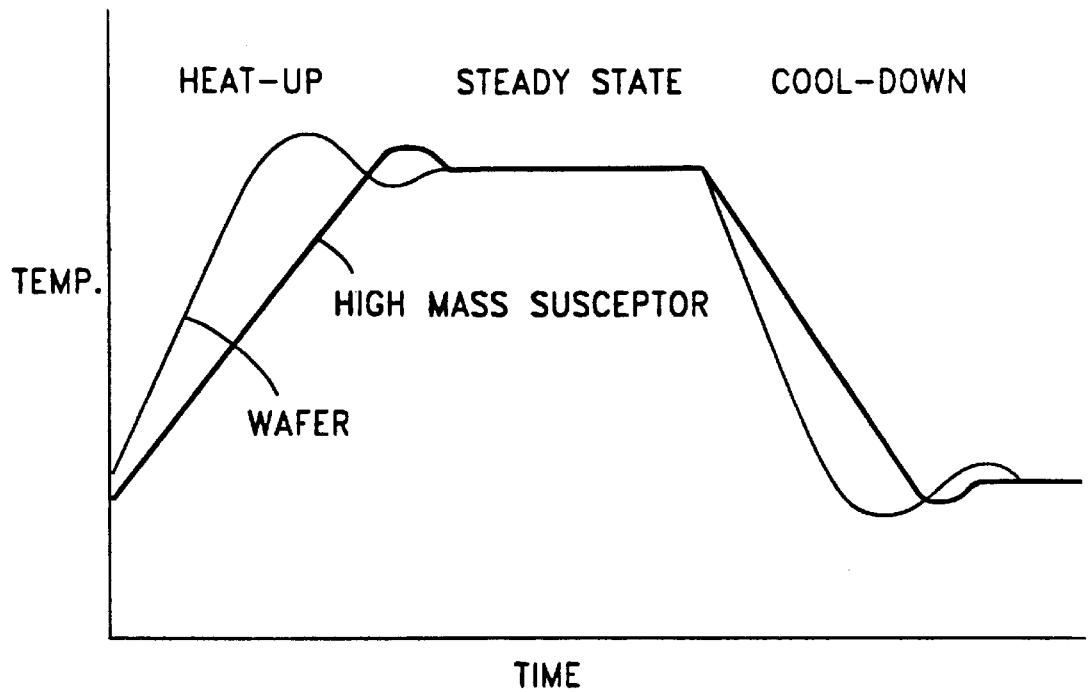
FIG. 1 is a schematic diagram of a heat-up and cool-down cycle of a wafer on a conventional single-wafer processing susceptor.
Figure 4:
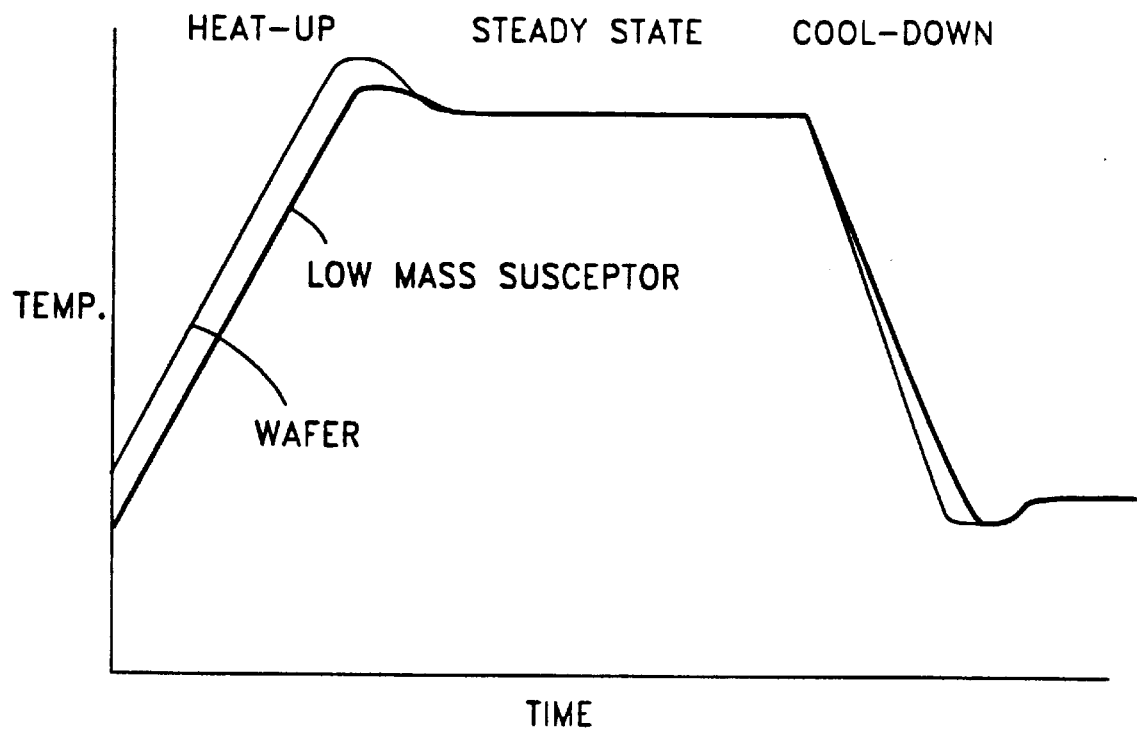
FIG. 4 is a schematic diagram of a heat-up and cool-down cycle of a wafer on a low-mass susceptor.

The present invention provides a low-mass susceptor which has a thermal mass of the same order of magnitude as the thermal mass of the wafer it supports. As seen in FIG. 4, the thermal response of such a susceptor with a wafer supported thereon during a heat-up and cool-down cycle is much more closely coupled to the wafer response than that shown in FIG. 1 for a conventional single-wafer processing susceptor. In particular, the temperature differences between the susceptor and wafer during temperature transients within the reaction chamber are less than in the arrangement of FIG. 1, and thus the uniformity and throughput of the system is improved.

Figure 2:
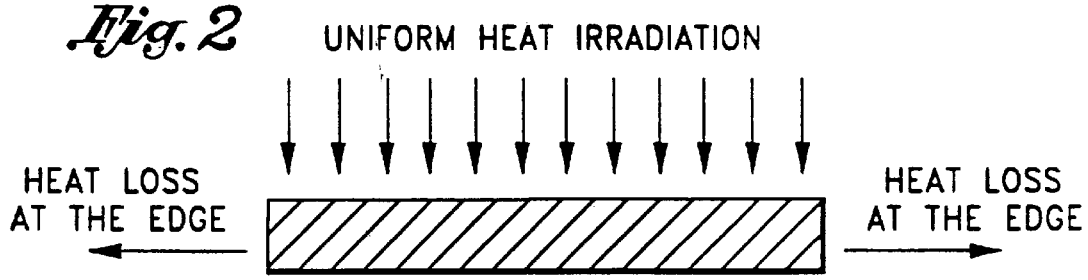
FIG. 2 is a schematic representation of the edge heat loss exhibited by a conventional single-wafer processing susceptor.
Figure 3:
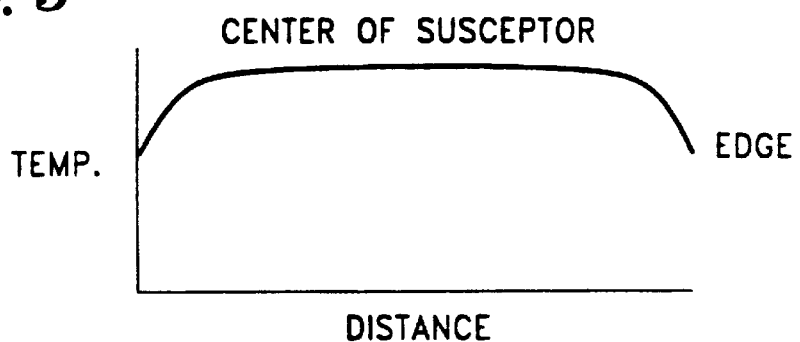
FIG. 3 is a diagram of the temperature across the susceptor shown in FIG. 2.
Figure 5:
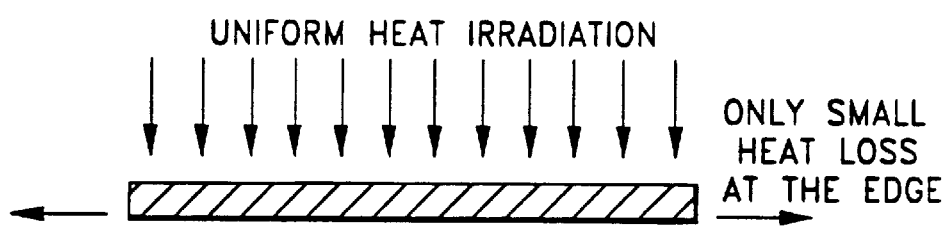
FIG. 5 is a schematic representation of the edge heat loss exhibited by a low-mass susceptor of the present invention.
Figure 6:
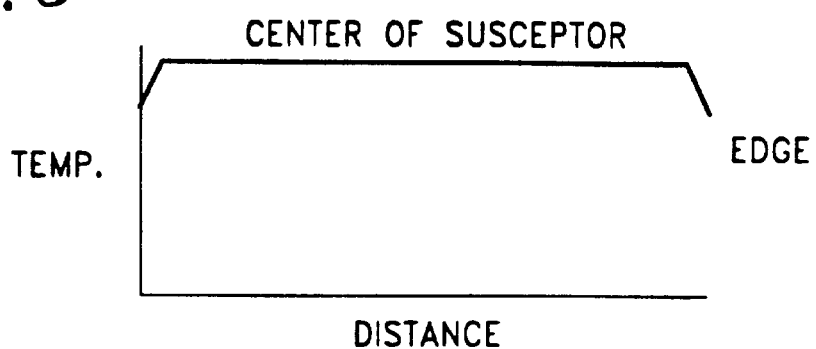
FIG. 6 is a diagram of the temperature across the low-mass susceptor shown in FIG. 5.

Assuming the physical properties (i.e., density and specific heat) of the wafer and the susceptor are roughly equivalent, the size of the two must therefore be approximately equal for their thermal masses to be equivalent. With a diameter approximately the same as the wafer, such a susceptor is relatively thin in comparison to prior susceptors. FIG. 5 illustrates schematically the temperature losses at the edges of a relatively thin susceptor, which are greatly reduced from temperature losses associated with a thick susceptor, as seen in FIG. 2. FIG. 6 illustrates this temperature profile, and it can be seen that the temperature across the susceptor is constant for a larger distance than for a thick susceptor, as seen in the diagram of FIG. 3. In other words, the susceptor edge losses are less in thin susceptors, which leads to greater temperature uniformity over the wafer.

Figure 7:
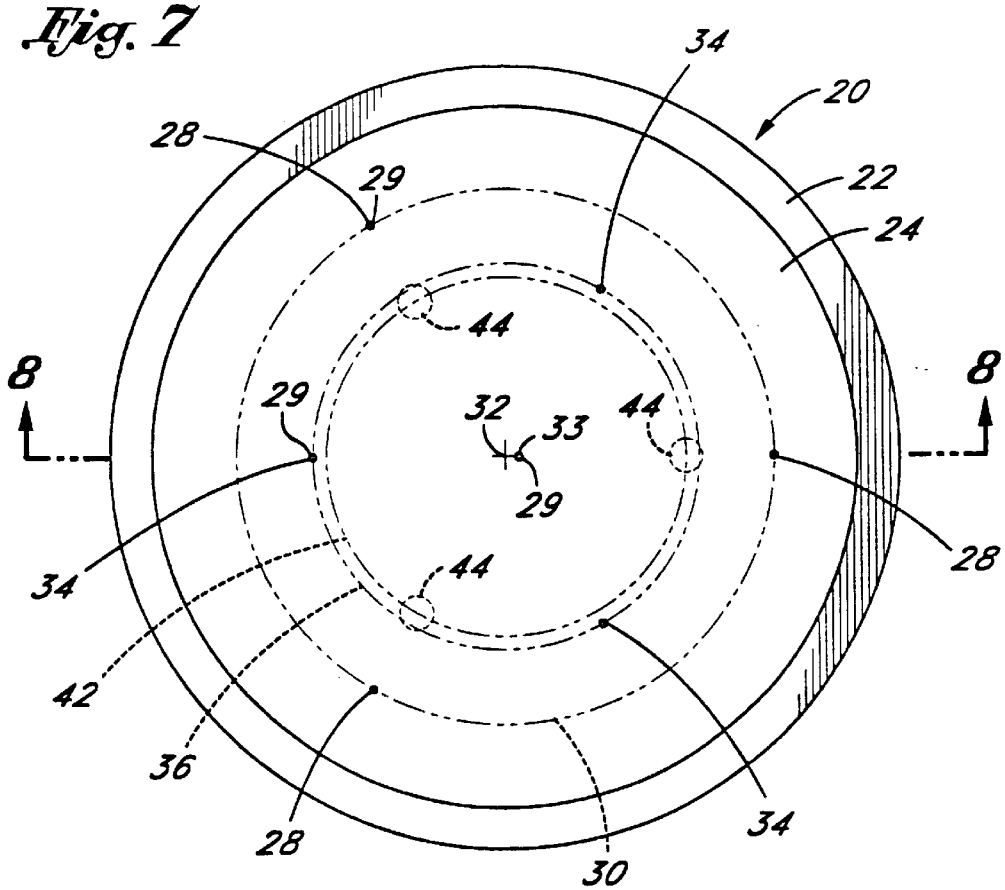
FIG. 7 is a top plan view of one embodiment of a low-mass susceptor of the present invention.
Figure 8:
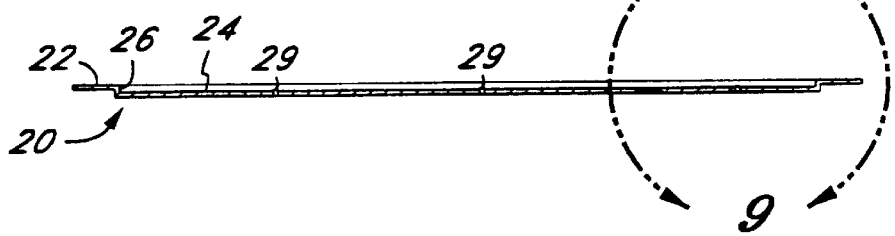
FIG. 8 is a cross-sectional view of the low-mass susceptor of FIG. 7 taken along line 8—8.
Figure 9:
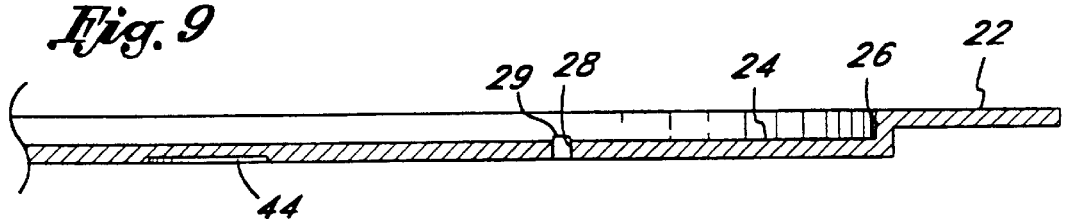
FIG. 9 is a detail of one edge of the low-mass susceptor of FIG. 8 within the circle 9—9.

FIGS. 7–9 illustrate one embodiment of a low-mass susceptor 20 according to the present invention. The susceptor 20 generally comprises a thin, disk-shaped circular body having opposed top and bottom surfaces and a peripheral circular edge 21. On the top surface, the susceptor 20 has an outer ledge 22 surrounding an inner wafer recess 24 formed below the top plane of the ledge at a shoulder 26. The wafer recess 24 is sized to receive a wafer therein so that the edge of the wafer is very close to the shoulder 26.

In one particular embodiment the low-mass susceptor 20 is constructed of solid silicon carbide having an outside diameter of approximately 8.8 inches (225 mm), while the wafer recess 24 has an outer diameter of approximately 7.9 inches (202 mm). Typically, single-wafer processing systems handle 200-mm diameter wafers so that the outer edge of the wafer is within 1 mm of the shoulder 26. The susceptor 20 is no more than about 0.032 inches (0.812 mm), and preferably is about 0.03 inches (0.8 mm) in thickness.

The edge surface area of the low-mass susceptor 20 is $0.5 \times 10^{-3}$ m$^2$, which is approximately 0.6% of the total surface area and significantly less than a conventional graphite susceptor, such as a production version of the susceptor shown in U.S. Pat. No. 4,821,674. The depth of the wafer recess 24 below the plane of the outer ledge 22 is about 0.028 inches (0.71 mm). Assuming a density of about 3200 kg/m3, the low-mass susceptor 20 has a mass of $9.2 \times 10^{-2}$ kg. Also, with a specific heat of 1135 J/kg/° K. at 800° K., the susceptor has an effective thermal mass under the wafer of about 83 J/° K., which is less than twice the thermal mass of a 200 mm wafer, and nearly ten times less than a conventional graphite susceptor, such as a production version of the susceptor shown in U.S. Pat. No. 4,821,674. Even taking into account the entire susceptor 20, including the peripheral portion outside of the circular area under the wafer, the thermal mass of the susceptor 20 is only about 105 J/° K., or slightly more than twice that of the 200 mm wafer. For the susceptor 20 the multiplication factor x for the effective thermal mass equals about 2,068. Thus, for 300 mm wafers, the effective thermal mass of the low mass susceptor 20 is about 186 J/° K., or less than twice the thermal mass of the wafer. The near equivalence of the thermal masses of the wafer and susceptor reduces temperature variations therebetween and improves system throughput.

In a prototype embodiment, the low-mass susceptor 20 has an outside diameter of 8.845–8.855 inches (224.66–224.92 mm), and a thickness of 0.0295–0.0315 inches (0.750 to 0.800 mm), while the wafer recess 24 has an outer diameter of 7.931–7.953 inches (201.45–202.00 mm). The depth of the wafer recess 24 below the plane of the outer ledge 22 is preferably between 0.0275–0.0285 inches (0.700 to 0.725 mm).

A plurality of spacers are provided creating a gap between the susceptor 20 and wafer. For this purpose, the illustrated susceptor 20 includes three small apertures 28 evenly spaced around a circle 30 formed about one-third of the way in from the periphery of the ledge 22 to the center 32. The apertures 28 receive wafer support pins 29 therein extending above the top of the wafer recess 24. A single aperture 33 slightly offset from the center 32 likewise receives a support pin 29. Three apertures 34 evenly spaced about a circle 36 closer to the center of the susceptor 20 than the first circle 30 also receive wafer support pins 29. The apertures 28, 33, 34, preferably extend through the body of the susceptor from the top to the bottom surface, but may also be formed partially therethrough. The circular groups of apertures 28, 34 are angularly offset by 60° from each other about the center 32 of the susceptor so that, with the offset center aperture 33, the aggregate of pins 29 defines an evenly distributed planar support platform for spacing the wafer over the susceptor 20. Only three such spacers or support pins are required to define a wafer platform, although the seven shown provide more support points under the wafer, and prevent bowing of the wafer from gravity.

Typically, the delivery of the wafer to the susceptor is performed by a wand or other pick-up device utilizing the Bernoulli principle to raise and transport the wafers from above using a downwardly directed gas flow. A spatula-type pick-up wand can also be used, however. When the wand returns to lift the processed wafers, the support pins 29 create a space between the wafer and recess 24 to eliminate any suction which may form therebetween. The support pins are positioned within the apertures 28, 34 and extend a specified distance above the wafer recess 24 to receive the wafer lowered by the wand. Typically, the pins 29 have a height above the wafer recess 24, as best seen in FIG. 9, sufficient to support the wafer so that the wafer top surface is even with or slightly above the ledge 22 for gas flow considerations. More particularly, in the preferred environment, gas flows over the ledge 22 first and then over the top surface of the wafer and generally parallel thereto. Any sudden physical impediment to the gas flow, such as a vertical step from the ledge 22 to the wafer, may create a discontinuity in the flow which adversely affects a desired uniform deposition on the wafer. Thus, the wafer is preferably spaced above the susceptor 20 to be even with the ledge 22.

The support pins are manufactured of a ceramic or naturally occurring or synthetically fabricated sapphire, sapphire being derived from aluminum oxide. The support pins in various forms are available from the Swiss Jewel Co. of Philadelphia, Pa. Alumina is a preferred ceramic which may be used. In an alternative configuration, the support pins may be formed of quartz, although this material will eventually devitrify from the repeated thermal cycling within the CVD environment. The apertures are approximately 0.025 inches (0.64 mm) in diameter and the pins have a stepped cylindrical construction with a smaller diameter tail fitting into the apertures and a larger diameter head resting on the edge of the apertures. In still another embodiment, the apertures 28, 34 are eliminated and silicon carbide support pins, spacers, or other protrusions are machined directly into the wafer recess 24.

Three susceptor support cavities 44 are illustrated evenly spaced about a third circle 42 located slightly radially inward from the second circle 36. The susceptor support cavities 44, shown in FIG. 9, each receive an arm of a support or spider assembly (not shown) positioned within the reaction chamber. The spider assembly may be stationary, but typically mounts to a rotating shaft to impart rotary motion to the susceptor for enhancing chemical deposition uniformity over the wafer. In one preferred embodiment, the spider assembly has a central hub with three arms extending radially outward then extending upward toward the bottom surface of the susceptor 20. The spider assembly is typically made of quartz or other radiation-transparent material capable of withstanding repeated extreme heat cycling.

The thermal mass of the susceptor 20 is slightly larger but within the same order of magnitude as the wafer. Consequently, the heat-up and cool-down cycle is similar to that shown in FIG. 4, with an attendant increase in throughput in contrast with prior large thermal mass susceptors.

Figure 10:
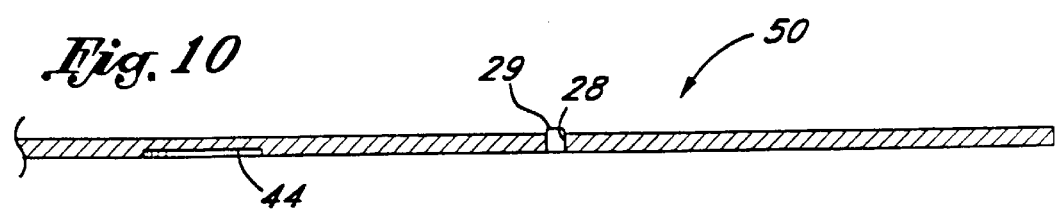
FIG. 10 is a detailed view of an edge of an alternative embodiment of a low-mass susceptor.

In an alternative embodiment, a low-mass susceptor 50, shown in FIG. 10, comprises a flat, disk-shaped body having a similar thickness as the susceptor 20 shown in FIG. 7, but without the depression defined by the wafer recess 24 and the shoulder 26. In other respects the susceptor 50 is identical to that shown in FIG. 7, with the wafer support pin apertures 28, 29, 34 and support arm cavities 44.

Figure 11:
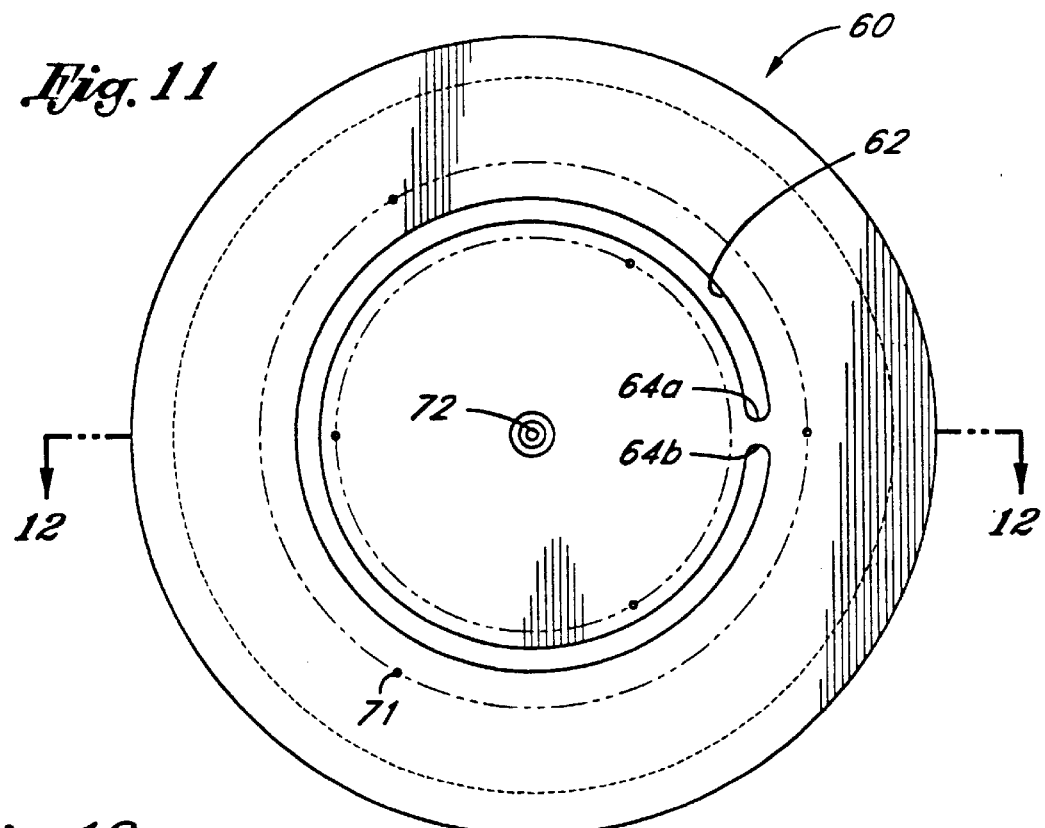
FIG. 11 is a bottom plan view of an alternative embodiment of a low-mass susceptor of the present invention made of open-cell foam.
Figure 12:
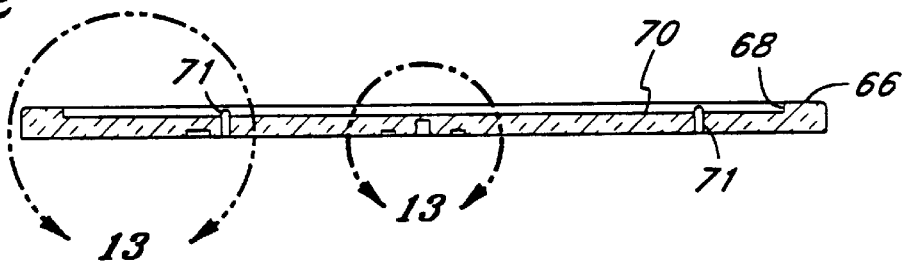
FIG. 12 is a cross-sectional view through the open-cell foam susceptor of FIG. 11 taken along line 12—12.
Figure 13:
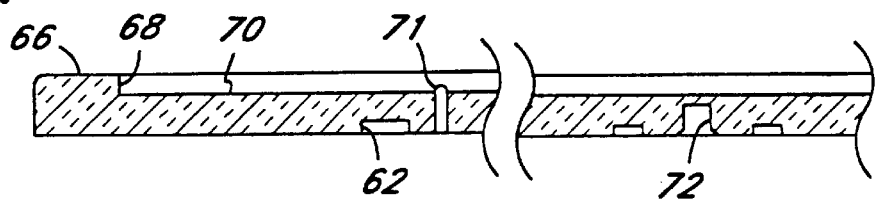
FIG. 13 is a detailed view of portions of the low-mass susceptor of FIG. 12 within the circles 13—13.

FIGS. 11–13 illustrate a second embodiment of a low thermal mass susceptor 60 which is constructed of open-cell silicon carbide foam. The bottom plan view of FIG. 11 illustrates a nearly complete circular groove 62 formed in the underside of the susceptor 60 for receiving susceptor support and rotation arms. As mentioned above, these support arms preferably extend from a quartz spider mounted on a rotatable shaft. One of the arms will contact one of the closed ends 64a or 64b of the groove 62 to impart angular force and rotational movement to the susceptor 60.

FIG. 12 illustrates a cross-sectional view of the susceptor 60 showing an outer circular ledge 66 which terminates at an inner diameter at a step 68 and a wafer recess 70. Support pins 71 are again fit into evenly distributed apertures to support the wafers slightly above the wafer recess 70. In one particular susceptor embodiment for supporting 200 mm wafers the recess 70 has a diameter of about 7.9 inches (20.1 cm). Thus, a 200-mm wafer extends to within 1 mm of the surrounding step 68. The depth of the wafer recess 70 is about 0.056 inches (1.42 mm). The outer diameter of the susceptor 60 is about 8.85 inches (22.5 cm), and its thickness at the ledge 66 is about 0.25 inches (6.35 mm).

The material of the susceptor 60 is preferably an open-celled silicon carbide foam. More particularly, the material may be an open-celled silicon carbide having a density of between 10–200 pores per inch (ppi), more preferably between 50–150 ppi. Various densities of the foam material are available from Energy Research and Generation, Inc. of Oakland, Calif.

Assuming a density of about 911 kg/m3, the low-mass susceptor 60 has a mass of $2.3 \times 10^{-1}$ kg. Also, with a specific heat of 1135 J/kg/° K. at 800° K., for a silicon carbide foam having 200 ppi, the susceptor 60 has an effective thermal mass (directly under the 200 mm wafer) of about 206 J/° K., which is about four times as large as the thermal mass of a wafer, and about one-quarter the effective thermal mass of a conventional graphite susceptor, such as a production version of the susceptor shown in U.S. Pat. No. 4,821,674. Even taking into account the entire susceptor 60, including the peripheral portion outside of the circular area under the wafer, the thermal mass of the susceptor 60 is about 261 J/° K., or slightly more than 5 times that of the wafer. For the susceptor 60 the multiplication factor x for the effective thermal mass equals about 5,157 J/° K./$m_2$. Thus, for 300 mm wafers, the effective thermal mass of the open-cell foam susceptor 60 is about 464 J/° K., about four times the thermal mass of the wafer. Although the thermal mass of the susceptor 60 is larger than the wafer, it is still of the same order of magnitude, and temperature variations between the two elements caused by temperature transients in processing is a significant improvement. Importantly, the susceptor 60 will cool down much faster than previous susceptors, thus improving the system throughput.

In a prototype embodiment, the wafer recess 70 has a diameter of between 7.931–7.953 inches (201.45–202.00 mm), while the depth of the wafer recess 70 is preferably between 0.0555–0.0565 inches (1.41–1.43 mm). The outer diameter of the susceptor 60 is preferably between 8.845–8.855 inches (224.66–224.92 mm).

FIG. 11 illustrates a recess 72 in the central underside of the susceptor 60 for receiving a temperature-sensing device. More particularly, the central recess 72 provides access for a temperature-sensing thermocouple terminating just underneath the top surface of the susceptor 60. That is, the thickness of the susceptor 60 above the recess 72 is minimized for enhancing the accuracy of the temperature-sensing thermocouple in detecting the temperature at the center of the wafer. This thickness is preferably no more than 0.03 inches (0.8 mm). Alternatively, a hole through the susceptor may be formed to directly sense the temperature of the underside of the center of the wafer. Outer temperature-sensing thermocouples to detect the temperature at the radial periphery of the susceptor may be placed in a stationary ring (not shown) surrounding the susceptor. The thermocouples are used to provide feedback to the control system for adjusting heat supplied by the radiant lamps outside the quartz chamber.

Figure 14:
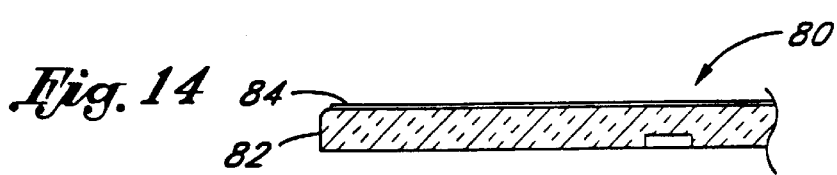
FIG. 14 is a detailed view of an alternative embodiment of the open-cell foam susceptor having an upper layer of silicon carbide thereon.

FIG. 14 illustrates a second embodiment of an open-celled foam, low-mass susceptor 80. The susceptor 80 comprises a lower foam portion 82 and an upper wafer support surface or skin 84. The foam portion 82 is substantially similar to the foam susceptor 60 illustrated in FIGS. 11–13, without the central recess defined by the step 68 and wafer recess 70. The skin 84 is preferably formed of dense silicon carbide, or other similar expedient, defining a flat wafer support surface. The thickness of the skin 84 is preferably less than the thickness of the wafer, and more desirably is only several hundred microns. The skin 84 is formed by deposition on the foam portion 82. Although not shown, support pins may be provided extending above the skin 84.

Although the illustrated embodiment shows a flat, planar skin 84 on the top surface of the susceptor 80, alternatively, the entire susceptor could be covered with the dense silicon carbide. Covering the entire open-cell foam susceptor 80 with a skin of silicon carbide helps reduce particulates within the reactor chamber which might tend to absorb or otherwise collect on the exposed open-cell foam material. Furthermore, the open-cell foam may require more time to outgass reactants or other gasses before cycling to a new process, which slows throughput. The silicon carbide skin prevents this absorption. Again, open-cell foam susceptors completely coated with a skin of silicon carbide are commercially available for various specifications from Energy Research and Generation, Inc. of Oakland, Calif. It is contemplated that the skin of silicon carbide will be polished or ground after the coating operation to result in a smooth exterior less likely to collect contaminants.

Figure 15:
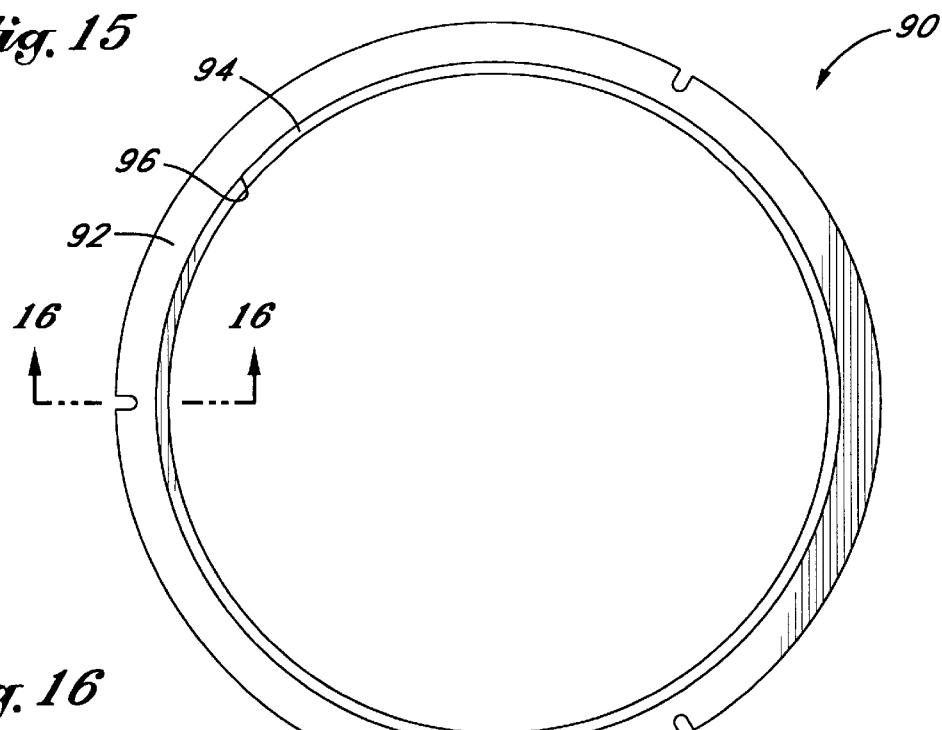
FIG. 15 is a top plan view of a ring-shaped embodiment of a low-mass susceptor of the present invention.
Figure 16:
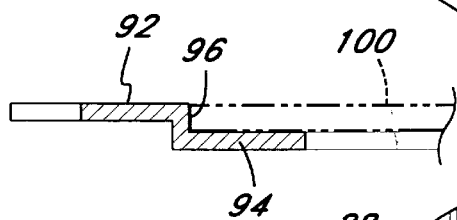
FIG. 16 is a detail of one edge of the low-mass susceptor of FIG. 15 within the circle 15—15.

FIGS. 15 and 16 illustrate an ultra low-mass ring-shaped susceptor 90. The susceptor 90 comprises an outer ledge 92 elevated above a radially inward shelf 94 at a step 96. A plurality of notches 98 formed in the outer periphery of the ledge 92 receive drive arms of a rotatable susceptor support (not shown). FIG. 16 shows a wafer 100 in phantom supported on the shelf 94.

The dimensions of the susceptor 90 are similar to those for the low-mass susceptor 20 of FIG. 7 with a thickness of about 0.03 inches (0.76 mm), an outside diameter of approximately 8.8 inches (22.35 cm), and a step 96 diameter of the approximately 7.9 inches (20.06). The step 96 has a depth approximately equal to the wafer 100. The inner diameter of the shelf 94 forming an aperture under the wafer 100 is about 7.7 inches (19.56 mm). In a preferred embodiment, the susceptor 90 is formed of silicon carbide, and its effective thermal mass is about 3.7 J/° K. which is less than ten times the thermal mass of a 200 mm wafer (48 J/° K.), and about two hundred times less than a conventional graphite susceptor, such as a production version of the susceptor shown in U.S. Pat. No. 4,821,674.

Figure 17:
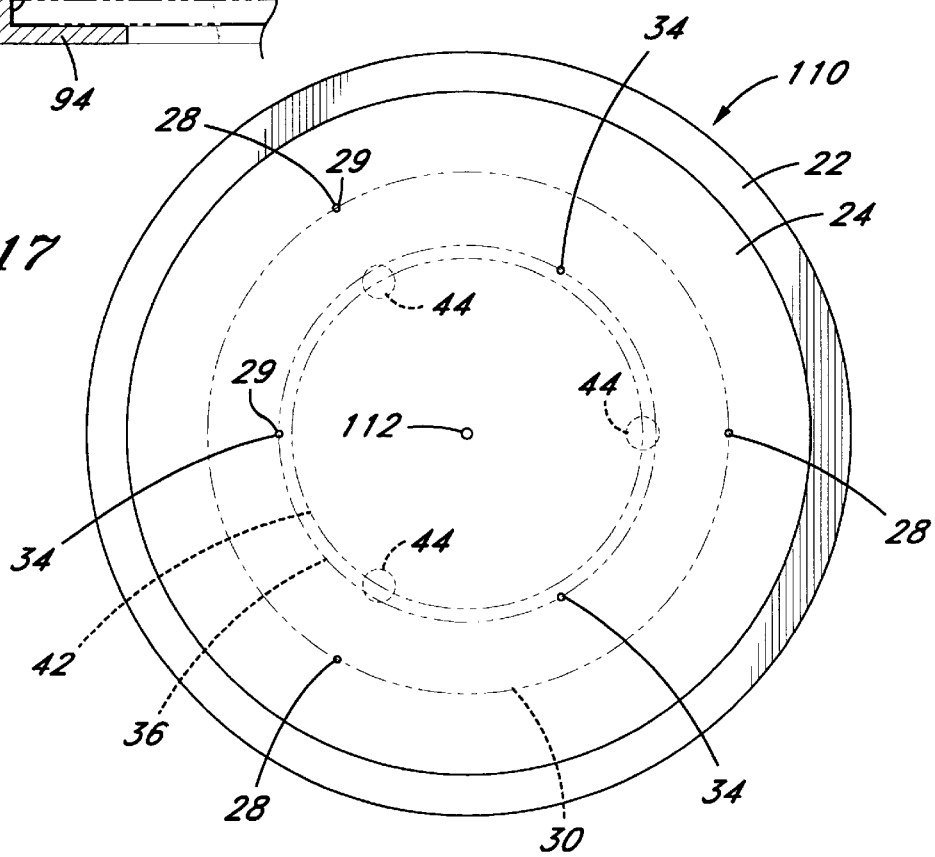
FIG. 17 is a top plan view of an alternative embodiment of a low-mass susceptor of the present invention similar to FIG. 7 but with a central temperature sensing hole.

FIG. 17 illustrates an alternative low-mass susceptor 110 of the present invention similar to that shown in FIG. 7 but with a central through hole 112. In this alternative, a temperature sensing device, such as a thermocouple or pyrometer, may be used to sense the temperature of the wafer backside. The through hole 112 is sized within the inner circle 36 so as to maintain susceptor area for six of the apertures 28, 34 for receiving support pins 29, with the central offset aperture 33 not utilized.

Figure 18:
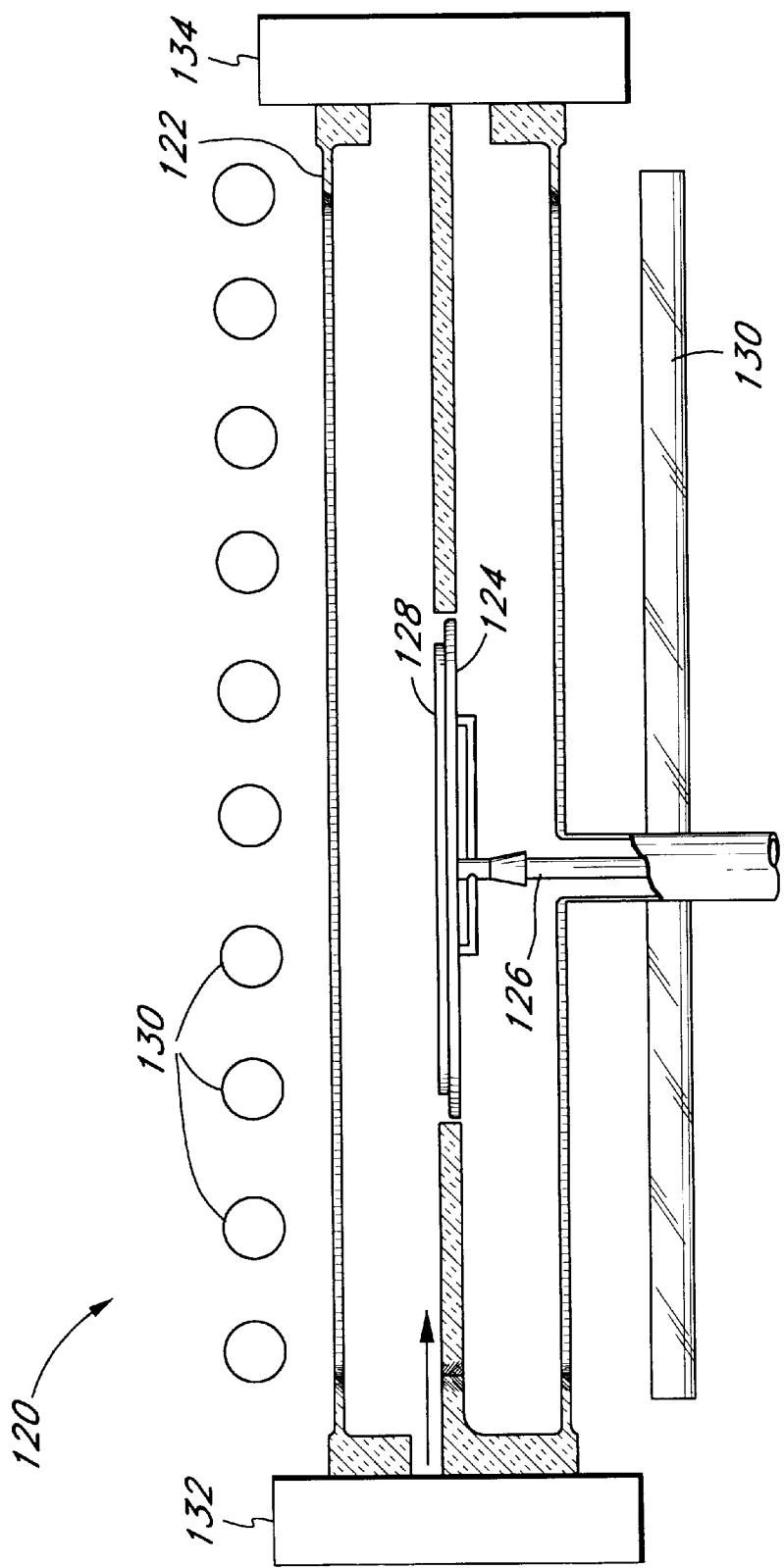
FIG. 18 is a schematic cross-sectional view of a reaction chamber for wafer processing using the present low-mass susceptor.

FIG. 18 schematically illustrates a wafer processing reactor 120 comprising a chamber 122 in which a low-mass susceptor 124 is positioned on a rotating pedestal 126. A wafer 128 is supported on the susceptor 124. The chamber 122 may be quartz or other material suitable for efficiently transmitting radiant energy from a plurality of heat lamps 130 positioned above and below the chamber to the susceptor 124 and wafer 128. A gas inlet 132 on one end of the chamber 122 introduces reactant gas which then flows in the direction indicated over the susceptor 124 and wafer 128 to a gas outlet 134. The thermal energy from the radiant heat lamps 130 heats the wafer which causes the reactant gas to deposit on the wafer. Of course, the low-mass susceptor 124 may be suitably used in other reactors 120, such as plasma-enhanced reactors, or perpendicular flow "showerhead" type reactors.

It will be noted that the low-mass susceptor 124 responds fairly uniformly to radiant heat generated by the surrounding lamps 130, and thus complex sensing means are not required to monitor the temperature at points around the susceptor. As mentioned previously, a central thermocouple (not shown) may be positioned just under the susceptor 124 middle, or within an open or closed bore in the center of the susceptor, to obtain the temperature at that point which is representative of the temperature across the susceptor. In this regard, the thermocouple may extend through the hollow middle of the rotating pedestal 126 to reach the underside of the susceptor 124.

Although this invention has been described in terms of certain preferred embodiments, other embodiments that are apparent to those of ordinary skill in the art are also within the scope of this invention. For example, although the several susceptor embodiments are particularly suited for use in high-temperature reactor ovens due to their relatively low thermal mass, they can also be utilized in low temperature applications.

What is claimed is:

1. A low-mass susceptor adapted for CVD processing of wafers positioned thereon, comprising:

a circular disk-shaped, rigid, open-cell silicon carbide foam body defining top and bottom surfaces and a peripheral edge, wherein said susceptor has a central circular portion with a size equal to that of the wafer to be supported, wherein, in SI units, the thermal mass of said portion is less than 6,000 times the square of the diameter of said portion.

2. The low-mass susceptor of claim 1, including a central downwardly facing cavity for receiving a sensing end of a thermocouple.

3. The low-mass susceptor of claim 2, wherein said cavity terminates just below the top surface of the susceptor for enhanced accuracy in reading the temperature at the center of the wafer.

4. The low-mass susceptor of claim 1, wherein said body includes a circular wafer-receiving recess concentrically formed in said top surface.

5. The low-mass susceptor of claim 4, comprising at least three pins projecting from said top surface and defining a wafer support platform parallel to said top surface.

6. The low-mass susceptor of claim 5, wherein said pins are formed separately from said body, said susceptor including pin-receiving apertures opening to said top surface.

7. The low-mass susceptor of claim 6, wherein said pins are sapphire.

8. The low mass susceptor of claim 6, wherein said pins are quartz.

9. The low-mass susceptor of claim 1, including a thin skin of dense silicon carbide thereon.

10. The low-mass susceptor of claim 9, wherein said thin skin of dense silicon carbide is deposited on said top surface.

11. The low-mass susceptor of claim 1, wherein said open cell foam has a density of between 10–200 pores per inch.

12. The low-mass susceptor of claim 11, wherein said open cell foam has a density of between 50–150 pores per inch.

13. A combination for use in CVD systems, comprising:
   a semiconductor wafer having a thickness and a diameter; and
   a disk-shaped susceptor for supporting the wafer having top and bottom surfaces and a peripheral edge, wherein the thermal mass of the susceptor is less than six times the thermal mass of the wafer, wherein the susceptor is constructed of an open-cell foam material.

14. The combination of claim 13, wherein the susceptor is constructed of a silicon carbide foam.

15. The combination of claim 14, wherein the susceptor is constructed of a core of silicon carbide foam having a skin of solid silicon carbide at least on said top surface.

* * * * *